(12) United States Patent
Menzel et al.

(10) Patent No.: US 9,673,784 B2
(45) Date of Patent: Jun. 6, 2017

(54) USING PULSED BIASES TO REPRESENT DC BIAS FOR CHARGING

(71) Applicant: Apple Inc., Cupertino, CA (US)

(72) Inventors: Brian C. Menzel, Sunnyvale, CA (US); Jeffrey M. Alves, Pleasanton, CA (US); Kevin M. Keeler, Los Gatos, CA (US); Zachary C. Rich, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 667 days.

(21) Appl. No.: 14/086,737

(22) Filed: Nov. 21, 2013

(65) Prior Publication Data
US 2015/0137617 A1    May 21, 2015

(51) Int. Cl.
*H03K 3/01*  (2006.01)
*H03K 5/04*  (2006.01)
*H03K 5/13*  (2014.01)

(52) U.S. Cl.
CPC ............. *H03K 3/01* (2013.01); *H03K 5/04* (2013.01); *H03K 5/13* (2013.01); *Y10T 307/747* (2015.04)

(58) Field of Classification Search
None
See application file for complete search history.

(56) References Cited

U.S. PATENT DOCUMENTS

| | | | |
|---|---|---|---|
| 5,157,319 A | 10/1992 | Klontz et al. | |
| 5,710,503 A | 1/1998 | Sideris et al. | |
| 5,742,148 A | 4/1998 | Sudo et al. | |
| 5,764,572 A * | 6/1998 | Hammick | G11C 7/065 365/185.33 |
| 6,567,522 B1 * | 5/2003 | Blackburn | H04M 19/001 178/69 F |
| 6,825,620 B2 | 11/2004 | Kuennen et al. | |

(Continued)

FOREIGN PATENT DOCUMENTS

| | | |
|---|---|---|
| CA | 2489701 | 6/2006 |
| CN | 101621220 | 1/2010 |

(Continued)

OTHER PUBLICATIONS

Benjamin Martin_STIC Search Report_Jun. 9, 2016.*

(Continued)

*Primary Examiner* — Jared Fureman
*Assistant Examiner* — James Evans
(74) *Attorney, Agent, or Firm* — Brownstein Hyatt Farber Schreck, LLP

(57) ABSTRACT

Power transfer systems including a direct current source and a plurality of outputs operable in several modes. A ground mode may couple an output to circuit ground and a current mode may couple the output to the direct current source. The power transfer system may also include a controller configured to iteratively select a pair of outputs from the plurality of outputs. Once a pair is selected, the controller may set a first output of the pair of outputs to the current mode and the second to ground mode for a determined duration. After the duration has passed, the controller may set the first output to the ground mode and the second output to the current mode for the same duration. Thereafter the controller may select another pair of outputs.

21 Claims, 10 Drawing Sheets

(56) References Cited

U.S. PATENT DOCUMENTS

| | | | |
|---|---|---|---|
| 6,844,702 | B2 | 1/2005 | Giannopoulos et al. |
| 7,522,878 | B2 | 4/2009 | Baarman |
| 7,560,902 | B2 | 7/2009 | Unger |
| 7,605,496 | B2 | 10/2009 | Stevens et al. |
| 7,948,208 | B2 | 5/2011 | Partovi et al. |
| 7,952,322 | B2 | 5/2011 | Partovi et al. |
| 8,004,235 | B2 | 8/2011 | Baarman et al. |
| 8,129,864 | B2 | 3/2012 | Baarman et al. |
| 8,169,185 | B2 | 5/2012 | Partovi et al. |
| 8,330,414 | B2 | 12/2012 | Takahashi et al. |
| 8,446,046 | B2 | 5/2013 | Fells et al. |
| 8,531,153 | B2 | 9/2013 | Baarman et al. |
| 8,629,652 | B2 | 1/2014 | Partovi et al. |
| 8,629,654 | B2 | 1/2014 | Partovi et al. |
| 8,890,470 | B2 | 11/2014 | Partovi |
| 8,896,264 | B2 | 11/2014 | Partovi |
| 8,901,881 | B2 | 12/2014 | Partovi |
| 8,928,276 | B2 | 1/2015 | Kesler |
| 8,933,594 | B2 | 1/2015 | Kurs |
| 8,942,624 | B2 | 1/2015 | Singh et al. |
| 8,947,047 | B2 | 2/2015 | Partovi et al. |
| 9,000,620 | B2 | 4/2015 | Kim et al. |
| 9,018,898 | B2 | 4/2015 | Ziv et al. |
| 9,087,638 | B2 | 7/2015 | Oettinger |
| 9,106,083 | B2 | 8/2015 | Partovi |
| 9,112,362 | B2 | 8/2015 | Partovi |
| 9,112,363 | B2 | 8/2015 | Partovi |
| 9,112,364 | B2 | 8/2015 | Partovi |
| 9,178,369 | B2 | 11/2015 | Partovi |
| 9,178,387 | B2 | 11/2015 | Mohammadian et al. |
| 9,257,851 | B2 | 2/2016 | Baarman et al. |
| 9,276,437 | B2 | 3/2016 | Partovi et al. |
| 9,356,659 | B2 | 5/2016 | Partovi |
| 9,362,779 | B2 | 6/2016 | Takahashi |
| 9,407,109 | B2 | 8/2016 | Takahashi et al. |
| 2002/0181177 | A1* | 12/2002 | Ker .................. H01L 27/0251 361/56 |
| 2009/0256498 | A1* | 10/2009 | Morooka ............ H05B 41/295 315/307 |
| 2009/0315728 | A1* | 12/2009 | Ales, III ................. A61F 13/42 340/604 |
| 2010/0072968 | A1* | 3/2010 | Bianco .................. H02M 3/156 323/284 |
| 2011/0050164 | A1 | 3/2011 | Partovi et al. |
| 2011/0221385 | A1 | 9/2011 | Partovi et al. |
| 2012/0068548 | A1 | 3/2012 | Endo et al. |
| 2013/0093388 | A1 | 4/2013 | Partovi |
| 2013/0099563 | A1 | 4/2013 | Partovi et al. |
| 2013/0162051 | A1 | 6/2013 | Michihata et al. |
| 2013/0260677 | A1 | 10/2013 | Partovi |
| 2013/0271069 | A1 | 10/2013 | Partovi |
| 2013/0285604 | A1 | 10/2013 | Partovi |
| 2013/0285605 | A1 | 10/2013 | Partovi |
| 2013/0300204 | A1 | 11/2013 | Partovi |
| 2014/0103873 | A1 | 4/2014 | Partovi et al. |
| 2014/0132210 | A1 | 5/2014 | Partovi |
| 2014/0191568 | A1 | 7/2014 | Partovi |
| 2014/0306654 | A1 | 10/2014 | Partovi |
| 2015/0061588 | A1 | 3/2015 | Alves et al. |
| 2015/0097443 | A1 | 4/2015 | Moyer et al. |
| 2015/0130412 | A1 | 5/2015 | Partovi |
| 2015/0194814 | A1 | 7/2015 | Taylor et al. |
| 2015/0244341 | A1 | 8/2015 | Ritter et al. |
| 2015/0303699 | A1 | 10/2015 | Wagman et al. |
| 2016/0134134 | A1 | 5/2016 | Baarman et al. |

FOREIGN PATENT DOCUMENTS

| | | |
|---|---|---|
| CN | 101902062 | 12/2010 |
| JP | H0767263 | 3/1995 |
| KR | 20100110356 | 10/2010 |
| WO | WO 2008/044875 | 4/2008 |
| WO | WO 2013/090565 | 6/2013 |
| WO | WO 2013/142720 | 9/2013 |

OTHER PUBLICATIONS

Zhusheng et al., "Design and Application of Wireless Charging Technology for Electric Vehicle," Electric Age, May 31, 2012, vol. 5, pp. 26-28 (10 pages with translation).
U.S. Appl. No. 14/468,995, filed Aug. 26, 2014, Alves et al.
U.S. Appl. No. 14/503,366, filed Sep. 30, 2014, Alves et al.
U.S. Appl. No. 14/503,363, filed Sep. 30, 2014, Moyer et al.
U.S. Appl. No. 15/152,444, filed May 11, 2016, Hrinya et al.

* cited by examiner

USING PULSED BIASES TO REPRESENT DC BIAS FOR CHARGING

FIELD

This disclosure relates generally to environmentally exposed electrical contacts, and more particularly, to methods and apparatuses to inhibit or prevent electrochemical corrosion thereon.

BACKGROUND

Continuing demand for advancement of electronic devices motivates improvements in durability and portability. These devices may include cell phones, smart phones, tablet computers, laptop computers, wearable devices, navigation devices, sports devices, accessory devices, or other similar products. Many of these portable electronic devices may include internal batteries which may be charged through a connection to an external direct current power source from time to time. An external power source connection may often require two or more exposed electrically conductive contact areas which mate with a respective one of an electrically conductive contacts associated with the external power source.

As the device is introduced to diverse environmental conditions, the electrically conductive contacts may be exposed to liquids or humidity. In some circumstances, an electrically conductive contact may be exposed to an electrolyte (e.g., by immersion, condensation, etc.) which may facilitate an oxidation-reduction reaction on the surface of the contact when a direct current bias is applied to the contact. After extended periods of use without proper cleaning of the contact surface, the electrical contacts may corrode. In other examples, galvanic corrosion may also occur between the external contact and the internal contacts. In either case, corrosion may decrease the charging efficiency of the device or may prevent the device from being charged at all. In certain cases, corrosion may become so advanced that a device must be repaired. Repairs may be costly and frustrating to users.

In other cases, dendrites may form along the edges of a contact exposed to moisture and an electrical field. Such an environment may encourage metal ions to migrate and congregate, forming dendrites at locations along the perimeter of the contact. After a time, these dendrites may form an electrical connection between adjacent electrical contacts, negatively interfering with device operation or potentially irreparably damaging the device.

To mitigate these issues, external contacts may typically include a corrosion-resistant coating to the exposed exterior surface. For example, some contacts may be electroplated with corrosion-resistant metals such as gold or platinum. Other examples include contacts with coatings that may be electrically conductive and corrosion-resistant. Although temporarily effective, such coatings are subject to frictional wear and may become less effective over the life of a device.

Furthermore, present demand for electronic devices of smaller size has necessitated a corresponding decrease in the space a charging port may occupy. As a result, charging contacts within charging ports have also decreased in size and have been positioned closer together. This in turn may increase the possibility that even minor corrosion or dendrite growth to the conductive contact areas may have a major effect on charging efficiency, device lifespan, and overall usability.

Accordingly, there may be a present need for improved methods or apparatuses that prevent or substantially inhibit corrosion and dendrite growth on externally exposed electrically conductive contact areas that does not rely on corrosion-resistant coatings.

SUMMARY

Embodiments described herein may relate to or take the form of power transfer systems that include a direct current source and a plurality of outputs. In some embodiments, each of the many outputs may be operated in several modes. For example, a ground mode may couple an output to circuit ground and a current mode may couple the output to the direct current source. Such a power transfer system may also include a controller configured to iteratively select a pair of outputs from the plurality of outputs. Once a pair is selected, the controller may set a first output of the pair of outputs to the current mode and the second to ground mode for a determined duration. After the duration has passed, the controller may set the first output to the ground mode and the second output to the current mode for the same duration. Thereafter the controller may select another pair of outputs.

Certain embodiments may also include other modes for each output. For example, an output may also operate in a float mode in which the output is floating. In other words, the output may be disconnected from both circuit ground and from the direct current power source. In some cases, each of the outputs which are not a member of the current selected pair may be operated in the float mode.

In certain embodiments, the controller may be configured to select pairs of outputs such that each sequential pair contains two outputs that were not members of the previous pair. In this manner, a first and second output may be selected for a first pair, and a third and fourth output may be selected for the second pair. In such an embodiment, the first pair and the second pair do not share any common outputs. However, a third pair may include the first output paired with a fifth output. In this manner, the first and second pairs do not share any outputs, and the second and third pairs do not share any outputs.

In many embodiments, the duration that each output of a pair is operated in the current mode may be based, at least in part on the corrosion rates of the materials including each of the outputs of the selected pair of outputs. The corrosion rate may be determine by any number of suitable methods. For example, a corrosion rate for a particular material may be fixed. In another example, the corrosion rate for a particular material may change with the environment to that material is exposed. For example, a material may corrode faster in a humid environment. In such an example, the corrosion rate which may influence the duration each of the pair is in the current mode may vary from time to time.

In further embodiments, the determined duration of each selection may be based in part on the surface area of each of the outputs of the selected pair of outputs. For example, if the surface area of a first contact is larger than the surface of a second contact, the duration as applied to the first contact may be greater than the duration applied to the second contact. In other embodiments, the duration may also relate to the relative positioning of the outputs. For example, if two adjacent outputs are sufficiently close together, the duration may be shorter than if two adjacent outputs are far apart. In still further embodiments, the duration may dynamically vary from selected pair to selected pair based on other variables. For example, an amount of corrosion detected.

In still other embodiments, the controller may be configured to select pairs of outputs such that each output of the plurality of outputs is selected only a certain number of times per second. In this manner, wearing effects may be distributed evenly about the several contacts.

Other embodiments described herein may relate to or take the form of power transfer systems also including a direct current source and a plurality of outputs. In such an embodiment, the power transfer system may include an output controller which is configured to configured to iteratively select a pair of outputs from the plurality of outputs, and upon each selection, apply exactly one period of a selected direct current waveform to a first output of the selected pair of outputs with a second output of the selected pair of outputs connected to ground, apply one period of the selected direct current waveform to the second output with the first output connected to ground. The waveform may vary from embodiment to embodiment, or from selected output to selected output.

Still other embodiments described herein may also relate to or take the form of a method of reducing corrosion to outputs of a direct current power system. Such a method may include the steps of defining a plurality of output pairs from a plurality of outputs, determining a pair activation sequence such that each sequential pair contains two outputs that were not within the previous pair, and sequentially activating each pair in the activation sequence. Each of the activations may include connecting a first output of the pair to a direct current source and connecting a second output of the pair to a ground for a selected duration. After the duration has lapsed, the method may connect the second output to a direct current source and connect the first output to a ground for the selected duration. In this manner, the time which each of the first and second output are connected to ground and the current source is the same. Thereafter, the first output and the second output may be set to float.

In some embodiments, each sequential activation may occur immediately after the previous activation or, in some cases, each sequential activation may begin before the previous activation completes. As with other embodiments described, the duration may vary from embodiment to embodiment.

BRIEF DESCRIPTION OF THE FIGURES

Reference will now be made to representative embodiments illustrated in the accompanying figures. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

The use of the same or similar reference numerals in different drawings indicates similar, related, or identical items.

DETAILED DESCRIPTION

Figure 1A:
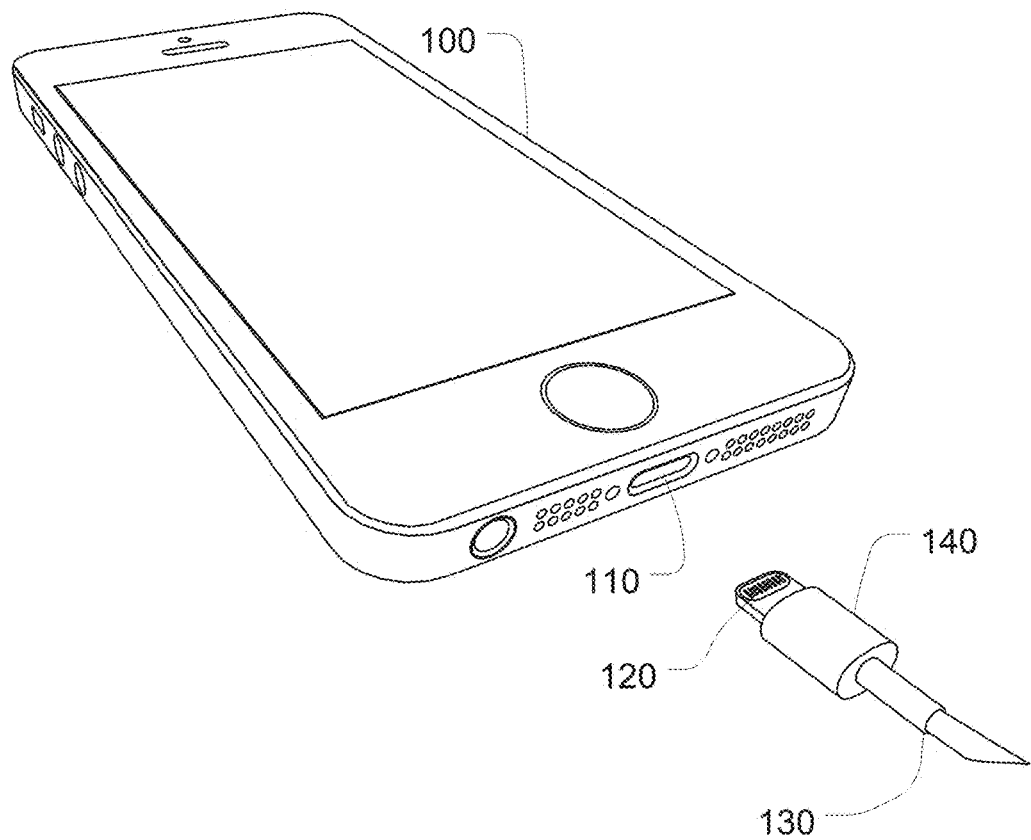
FIG. 1A is an elevated perspective view of a portable electronic device having a charging port including externally exposed charging contacts that may interface with externally exposed charging contacts of a power cable.

Embodiments described herein may relate to or take the form of power transfer systems for charging batteries within portable electronic devices.

Typically, power systems may include a power source (e.g., mains-connected transformer) and a cable having a connector with two exposed conductive contacts. The connector may be designed to interface with a port of an electronic device such that the two exposed contacts align with two corresponding conductive contacts of the portable device. Once the connector is coupled to the port, the power source may transfer direct current to the portable electronic device. In many typical examples, the portable electronic device may use the received power to replenish the charge of an internal battery. The connector and port may have complimentary geometry. For example, the connector may be a male connector and the port may be a female receptacle. In some examples, the connector may be exclusively used for power transfer or, in other cases, the connector may transfer power alongside data. Examples of such connectors may include universal serial bus ("USB"), FireWire, peripheral component interconnect express ("PCIe"), or other similar data ports.

Regardless the type of port or connector selected to transfer power, electrically conductive portions of both the port and connector must be at least partially exposed so that when the connector is coupled to the port, the contacts of the connector and port make physical contact. As a result, the contacts may be exposed to various environments as the portable electronic device is transported from place to place. In some circumstances, moisture may collect at the interface between the contacts of the connector and the contacts of the port. In some circumstances if the moisture is electrolytic it may facilitate an oxidation-reduction reaction between the surfaces of the contacts when direct current power is transferred between them. When direct current flows through an electrolyte, oxidation may occur at the anode (positive polarity contact), and reduction may occur at the cathode (negative polarity contact). Of particular note, by reversing the potential across the contacts, the reaction may proceed in the opposite direction. Accordingly, after extended periods of use without proper cleaning, the contacts may corrode as a result of the continued reaction. In other examples, galvanic corrosion may also occur between the connector contacts and the port contacts. One may appreciate that galvanic corrosion occurs under related circumstances to the oxidation-reduction reaction noted above.

In still other cases, metallic dendritic growths may form along the edges of a contact exposed to moisture and a constant or otherwise consistent electrical field. Again, that such an environment may encourage metal ions to migrate and congregate, forming dendrites at particular locations along the perimeter of the contact. After a time, these dendrites may form an electrical connection between adjacent electrical contacts, which in turn may negatively interfere with device performance. Corrosion and dendrite grown is undesirable because it may decrease the power transfer efficiency or it may prevent the power from being transferred at all. In certain cases, damage may advance such that the portable electronic device must be repaired or replaced. In other examples, the charging cable or dock may also need to be repaired or replaced.

Embodiments described herein relate to or take the form of power transfer systems that substantially reduce or eliminate the risk of corrosion. In certain embodiments, more than two contacts may be used in order to transfer power. For example, a power transfer system may include a plurality of power output contacts. Correspondingly, an electronic device may include a plurality of power input contacts. The plurality of power output contacts may be arranged into several pairs. The several pairs may then be sequentially activated one at a time such that a direct current potential difference is present between members of the currently activated pair. Activation of a pair of contacts may include fixing a positive potential between the selected pair for a proscribed period of time. In this manner, the corresponding power input contacts of the portable electronic device may complete the circuit and provide an electrical load such that direct current flows from the activated pair of power outputs to the corresponding pair of power inputs for the prescribed period of time.

One or more of the aforementioned corrosion reactions may initiate during the prescribed period of time direct current flows. As mentioned above, the corrosion reactions may progress relative to the direction of the current flow. Thus, by reversing the current flow, the reaction may be caused to progress the opposite direction. Therefore, by toggling the current flow quickly back and forth, the corrosion reaction may be entirely prevented from progressing at all.

For example, if the pair of power output contacts selected includes output contact A and output contact B, output contact A may be connected, or biased, to +5 volts and output contact B may be connected to circuit ground. In this manner, the potential when measured from A to B is +5 volts. After the prescribed period of time, for example 10 microseconds, output contact A may be connected to ground and output contact B may be connected to +5 volts. In this manner the potential difference when measured from A to B is −5 volts. One may appreciate, therefore, that any corrosion reaction which started when A was biased to +5V is mitigated when A is biased to −5V. In this manner, the amount of time each individual contact conducts direct current is substantially reduced and furthermore, due to the repeated reversal of the current direction, any oxidation-reduction reaction, galvanization reaction, or dendritic growth to the contact is substantially reduced or eliminated.

In further embodiments, more than one pair of outputs may be used. For example, a first pair may be activated and reversed in the aforementioned manner and a second pair may be similarly activated thereafter. Any number of pairs may be activated, and that any suitable pairing scheme may be used. For example, in some embodiments, the power transfer system may use four contacts, numbered 1-4. The number of unique pairs from a set of four numbers is equal to $(_2^4)=6$. In this example, the pairs may be set to (+5V, 0V) in the order of (1,2) (2,1) (3,4) (4,3) (1,3) (3,1) (2,4) (4,2) (1,4) (4,1) (2,3) (3,2). In alternate embodiments, a different order or pairing may be chosen. In another embodiment, the power transfer system may include eight contacts, number 1-8. The number of unique pairs from a set of eight numbers is $(_2^8)=28$. In this example, the pairs may be set to (+5V, 0V) in the order of (1,2) (2,1) (3,4) (4,3) (5,6) (6,5) (7, 8)(8,7) and so on. Again, as with the previous four-contact example, other pairings or orders are contemplated.

In certain embodiments, the order of the pairing of the plurality of outputs may be based on a number of variables. For example, two outputs of the pair may have a larger surface area than the other outputs of the pair. These outputs may be paired together more often than these two outputs are paired with contacts having smaller surface area. In another example, the contacts may be paired and ordered with the goal of preventing dendritic grown. The farther a voltage potential is physically separated, the more difficult it may be for dendritic growths to initiate. In other embodiments, the duration of activation of each pair may vary. For example, outputs having a larger surface area may be permitting to have a longer activation duration than outputs having a smaller surface area. In other embodiments, individual outputs may be composed of different materials each at a different risk of corrosion. In such an example, outputs composed of materials with a high risk of corrosion may have a shorter duration than outputs composed of materials with a low risk of corrosion.

A portable electronic device which is connected or otherwise coupled to a power source herein described may require specialized circuitry to process the power transited. For example, the power receiving circuitry which may be coupled to the power input contacts may be required to translate the constantly switching voltage into a useful constant or substantially constant direct current source. In certain embodiments, a portable electronic device may include a plurality of passive rectifier circuits each coupled to one of the plurality of inputs. For example, the passive rectifier may include a plurality of diodes arranged to deliver direct current based on the current flow direction. In this manner, no matter which input contact is receiving +5V and no matter which output contact is connected to ground, a substantially consistent +5V direct current may be used. In other embodiments, the portable electronic device may include active rectifier circuitry that intelligently switches between input contacts at a rate equal to the rate that the power transfer system is switching between output contacts.

These and other embodiments are discussed below with reference to FIGS. 1A-8. However, those skilled in the art will readily appreciate that the detailed description given herein with respect to these Figures is for explanatory purposes only and should not be construed as limiting.

FIG. 1A is an elevated perspective view of a portable electronic device 100 having a charging port 110 including externally exposed charging contacts (not shown) that may interface with externally exposed charging contacts 120 of a power cable 130. The power cable 130 may include a connector portion 140 supporting the exposed charging contacts 120.

Figure 1B:
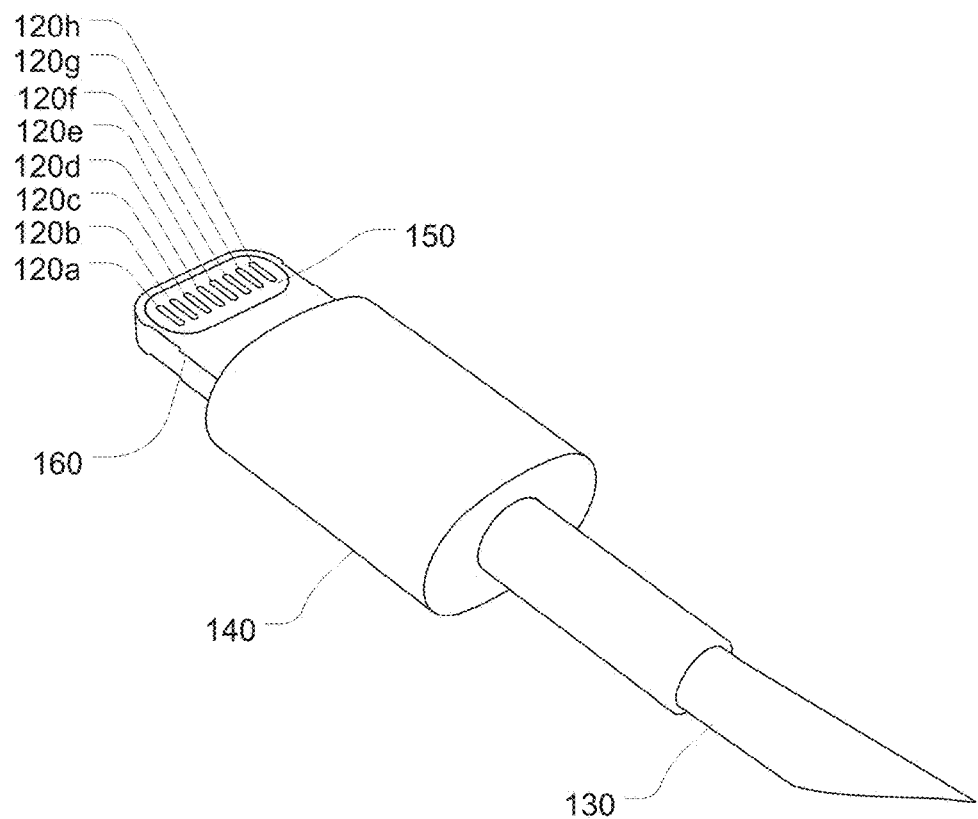
FIG. 1B is detailed elevated perspective view of a portion of a power transfer system as shown in FIG. 1A.

FIG. 1B is detailed view of the power cable 130. The power cable 130 may include a plurality of externally exposed contacts, 120*a*-120*h* (collectively 120), each separated by intervening portions of an insulator portion 150. Although shown as having substantially uniform surface area the externally exposed contacts 120*a*-120*h* need not necessarily be the same shape or size. For example, in some embodiments 120*a* may have a larger surface area than 120*h*.

In other embodiments, the externally exposed contacts 120 may be composed of an electrically conductive material such as metal. For example, the externally exposed contacts 120 may be comprised of copper. In other embodiments, the externally exposed contacts 120 may be made of a corrosion resistant metal such as gold or platinum. In still further embodiments, the externally exposed contacts may be substantially made from one metal while being plated with a second metal. For example, copper plated with gold.

The insulator portion 150 may be received within a structural portion 160. The structural portion 160 may be constructed of metal. In this manner, in some embodiments, the structural portion 160 may also serve as a general circuit ground. The shape of the structural portion 160 may vary from embodiment to embodiment based on the requirements of the port it may be received into (e.g., the portable electronic device 100 having port 110 in FIG. 1).

Figure 2:
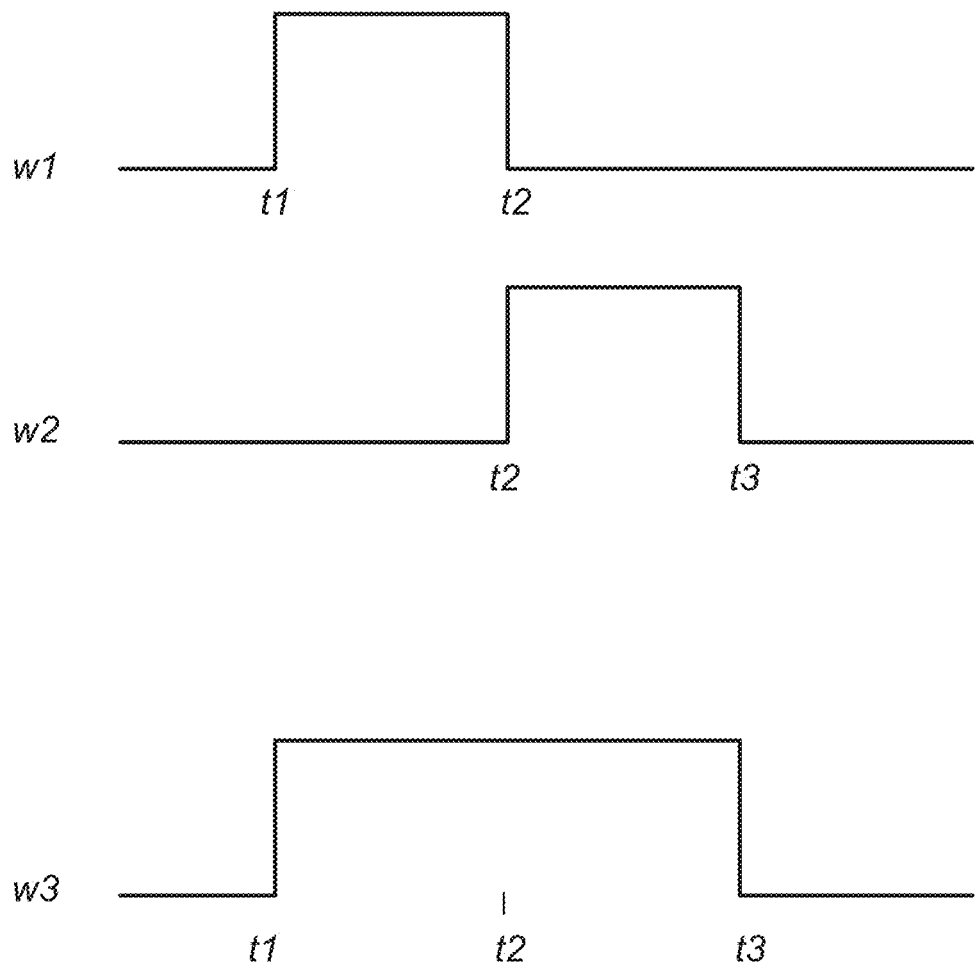
FIG. 2 shows three graphical representations of direct current waveforms that may be present at one or more externally exposed contacts of the embodiment shown in FIG. 1.

FIG. 2 shows three graphical representations of direct current waveforms that may be present at one or more externally exposed contacts of the embodiment shown in FIG. 1B. A first waveform w1 may take the shape of a square wave, illustrated in FIG. 2 as an ideal square wave with instantaneous rising and falling edges. In the illustrated embodiment, the waveform w1 may rise to +5V and fall to 0V, but any suitable voltage difference may be used. In the illustrated graphical representation, the waveform w1 enjoys a direct current bias from time t1 to time t2, falling at t2 to 0V.

A second waveform w2 may also take the shape of a square wave, illustrated as an ideal square wave with instantaneous rising and falling edges. In the illustrated graphical representation, the waveform w2 enjoys a direct current bias from time t2 to time t3, falling at t3 to 0V. The waveform w2 may rise at precisely the same time t2 that the waveform w1 falls.

The additive combination of the waveform w1 and w2 may be graphically represented by the waveform w3. In this manner, the waveform w3 may maintain a constant direct current bias from time t1 to time t3. The signals w1 and w2 may be combined in any number of suitable ways. For example, a rectifier circuit may be used.

One may also appreciate that if the circuits including w1 and w1 share a common circuit ground, that the waveforms w1 and w2 may graphically represent the voltage applied to a single pair of output contacts over the entire duration of the activation of the pair. For example, a first output contact may be presented with w1 and a second output contact maybe presented with w2. In this manner, at the time t2, the polarity of the first contact and the second contact is reversed.

Figure 3A:
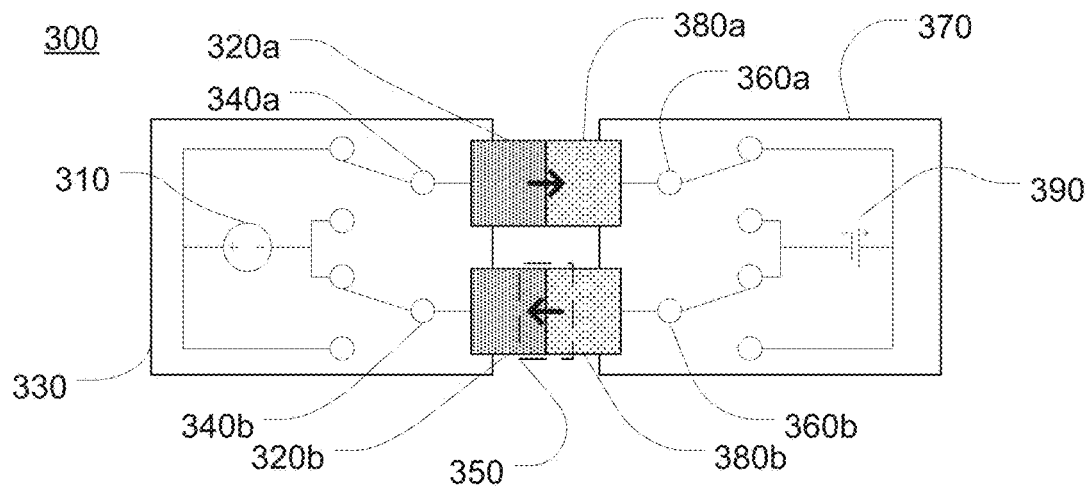
FIG. 3A is a schematic representation of a corrosion-resistant power transfer system having two outputs in a first state.

FIG. 3A is a schematic representation of a corrosion-resistant power transfer system 300. The power transfer system 300 may include a housing 330. Within the housing of the power transfer system 300 may be a direct current power source 310, and two outputs 320*a* and 320*b*. The outputs 320*a* and 320*b* may be at least partially external to the housing 330. Between the direct current power source 310 and the two outputs 320*a* and 320*b* (collectively 320) may be one or more switches 340*a* and 340*b* (collectively 340), each corresponding to a respective one of the outputs 320. Each of the switches 340 may have one or more states. As illustrated in FIG. 3A, each switch 340*a* and 340*b* has two states. For example, when the switch 340*a* is in a first position, the positive terminal of the direct current power source 310 may be electrically connected to the output 320*a*. In a second mode (not shown), the switch 340*a* may connect the output 320*a* to the negative terminal of the direct current power source 310.

Similarly, the switch 340*b* may be coupled to the output 320*b* in a manner such that when in a first position, the switch 340*b* places the output 320*b* in electrical connection with the negative terminal of the direct current power source. In a second position, the switch 340*b* may be electrically connect the output 320*b* to the positive terminal of the direct current power source 310.

The power transfer system may also require a load in order to adequately transfer power from the outputs 320. This load may be substantially enclosed within a housing 370. Within the housing 370, the load may include a battery 390 and two input contacts 380*a* and 380*b* (collectively 380). The two input contacts 380 may be at least partially external to the housing 370. The input contacts 380 may be positioned to align with the output contacts 320 so that power may be transferred therebetween. The load may also include two switches 360*a* and 360*b* (collectively 360) that selectively couple the inputs 380 to the positive and negative terminals of the battery 390 in much the same way that the switches 340 selectively couple the outputs 320 to the positive and negative terminals of the direct current power source 310. In order to provide a charge to the battery, the positive terminal of the direct current power 310 may be connected to the positive terminal of the battery. Accordingly, the state of the switches 340 and 360 must be synchronized in some manner.

As shown in FIG. 3A, the states of the switches 340 and 360 create a complete circuit. The path of electricity may initiate at the positive terminal of the direct current power source 310 and may pass through the switch 340*a* to the output terminal 320*a*. Current may pass through the output terminal 320*a* to the corresponding input terminal 380*a* in order to enter the housing 370 of the load. From the input terminal 380*a*, the current may flow into the switch 360*a* which may direct the current to the positive terminal of the battery 390. This configuration may charge the battery 390. Completing the circuit, the negative terminal of the battery 390 may be coupled to the input terminal 380*b* through the switch 360*b*. The output terminal 320*b* may receive the returning current from the input terminal 380*b*, returning the current and completing the circuit through the switch 320*b* to the negative terminal of the battery 390.

However, as described above, as a load or portable electronic device is transported from place to place, liquids may collect nearby exposed contacts such as outputs 320 and inputs 380. In some examples, an electrolyte 350 may partially or substantially overlap one or more of the several outputs 320 and one or more of the corresponding inputs 380. Along this overlap, the electrolyte 350 may catalyze a corrosion reaction. Specifically, in the embodiment illustrated, the corrosion reaction may occur at the interface between the output 320*b* and the input 380*b* when there is current flowing between them.

Figure 3B:
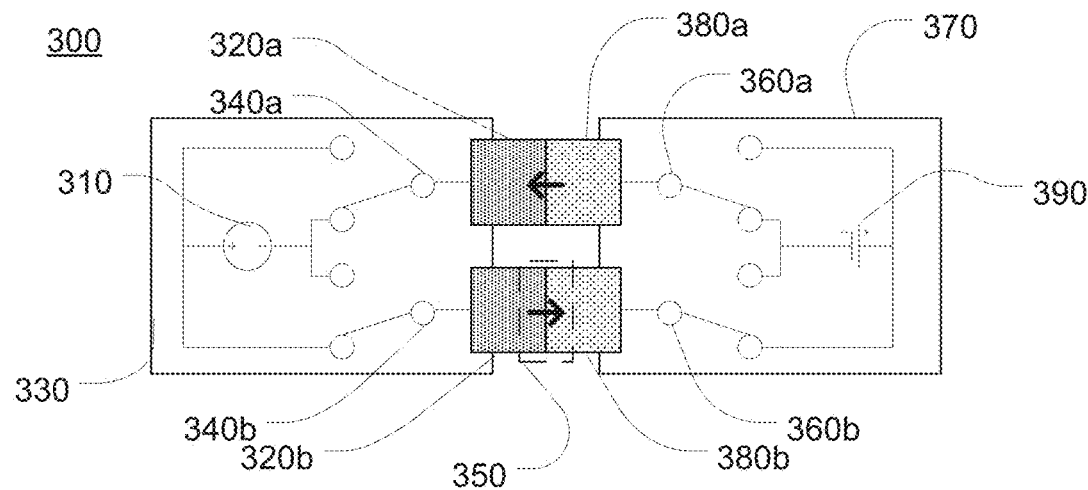
FIG. 3B is a schematic representation of the corrosion-resistant power transfer system of FIG. 3A in a second state.

FIG. 3B is a schematic representation of the corrosion-resistant power transfer system 300 of FIG. 3A in a second state. In this example, the switches 340 and 360 are all placed in a secondary position. In such a case, the flow of current for the circuit may be reversed. In this example, the path of electricity may once again initiate at the positive terminal of the direct current power source 310. Current may pass through the switch 340b to the output terminal 340b. Current may pass through the output terminal 320b to the corresponding input terminal 380b in order to enter the housing 370 of the load. From the input terminal 380b, the current may flow into the switch 360b which may direct the current to the positive terminal of the battery 390. This configuration may charge the battery 390. Completing the circuit, the negative terminal of the battery 390 may be coupled to the input terminal 380a through the switch 340a. The output terminal 320a may receive the returning current from the input terminal 380a, returning the current and completing the circuit through the switch 320a to the negative terminal of the battery 390.

In this manner, the waveform w1 shown in FIG. 2 may graphically represent the voltage from time t1 to t2, measured, for example from 320a to 320b as shown in FIG. 3A. Correspondingly, the waveform w2 as shown in FIG. 2 may graphically represent the voltage from time t2 to t3, measured, for example, from 320b to 320a as shown in FIG. 3B. The waveform w3 may graphically represent the voltage across the battery 390 from time t1 to t2 with respect to FIG. 3A and from time t2 to t3 with respect to FIG. 3B. In this manner, a constant direct current may be applied to the terminals of the battery 390 from time t1 to t3, even as the power transfer system 300 switches from the configuration shown FIG. 3A to the configuration shown in FIG. 3B.

Figure 4:
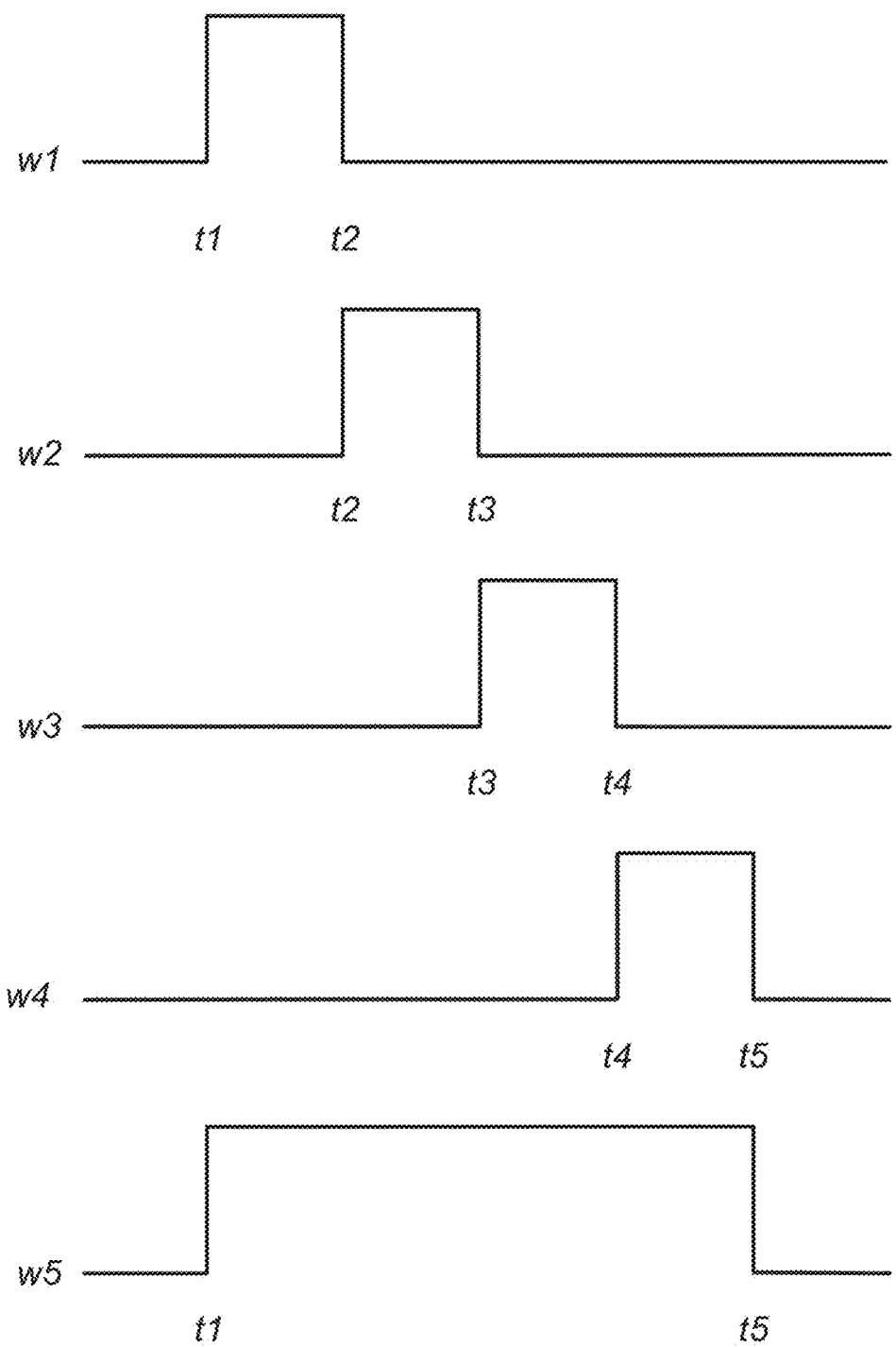
FIG. 4 shows five graphical representations of direct current waveforms that may be present at one or more externally exposed contacts of the embodiment shown in FIG. 1.

FIG. 4 shows five graphical representations of direct current waveforms that may be present at one or more externally exposed contacts of the embodiment shown in FIG. 1. This embodiment is similar to the embodiment illustrated in FIG. 4. A first waveform w1 may take the shape of a square wave, illustrated in FIG. 4 as an ideal square wave with instantaneous rising and falling edges. In the illustrated embodiment, the waveform w1 may rise to +5V and fall to 0V, but any suitable voltage difference may be used. In the illustrated graphical representation, the waveform w1 enjoys a direct current bias from time t1 to time t2, falling at t2 to 0V. Similarly, waves w3 and w4 may also be aligned corresponding to t3, t4, and t5. As with FIG. 2, the additive combination of the waveform w1 through w4 may be graphically represented by the waveform w5. In this manner, the waveform w5 may maintain a constant direct current bias from time t1 to time t5. The signals w1 and w4 may be combined in any number of suitable ways. In this manner, a constant direct current bias may be applied to circuits coupled to w5, and corrosion to outputs connected to w1-w4 may be prevented.

FIGS. 5A-5E are a schematic representations of a corrosion-resistant power transfer system 500 having four outputs. This embodiment is similar to the embodiment shown in FIGS. 3A and 3B, including four outputs and four inputs instead of the two shown in the embodiment of FIGS. 3A and 3B. For example, a corrosion-resistant power transfer system 500 may include four outputs and switch pairs 520a-d (collectively 520). Each output and switch pairs 520 may include a three-position switch. One position of the three-position switch may couple the respective output to a positive terminal of a direct current power source. A second position of the three-position switch may couple the respective output to a negative terminal of a direct current power source. The final position of the three: position switch may cause the respective output to float. In other words, while in the float position, the respective output may be disconnected from each of the terminals of the direct current power source.

Correspondingly, the embodiment shown in FIG. 5A-FIG. 5E includes a load portion having four inputs and switch pairs 580a-d (collectively 580). Each of the switches of the input and switch pairs may also be three: position switches such that each of the respective inputs may optionally connect to a positive terminal of the battery, a negative terminal of the battery, or may float.

Figure 5A:
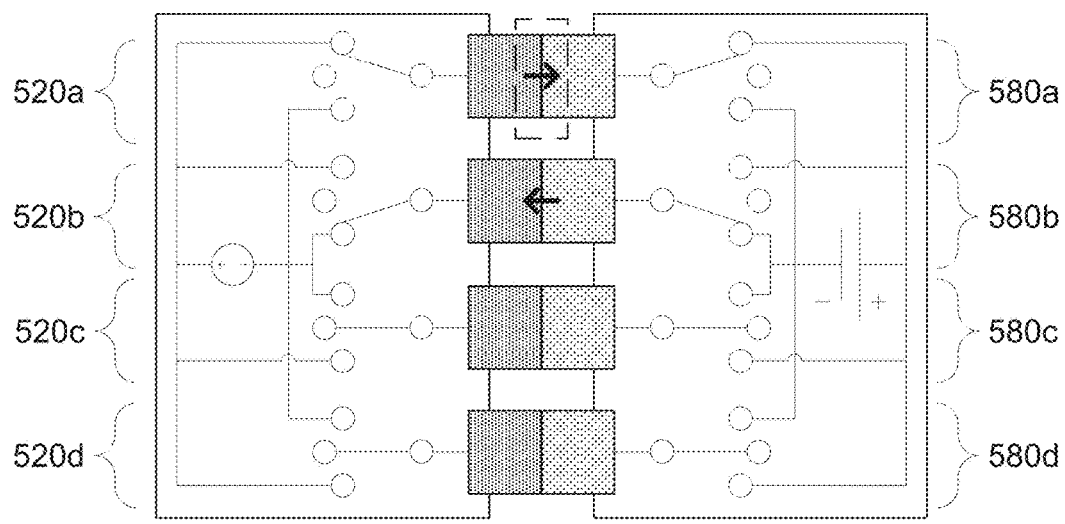
FIG. 5A is a schematic representation of a corrosion-resistant power transfer system having four outputs in a first state.
Figure 5B:
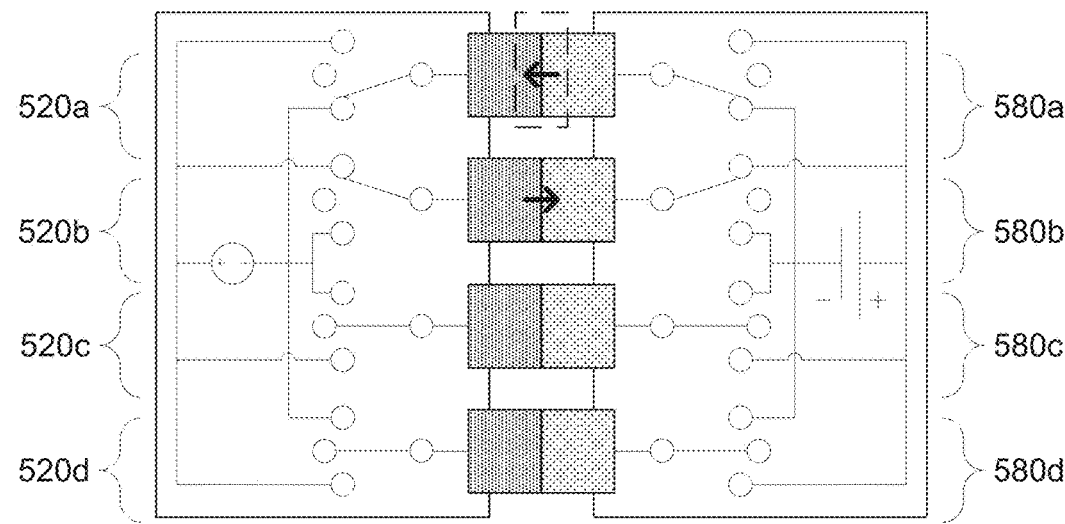
FIG. 5B is a schematic representation of the corrosion-resistant power transfer system of FIG. 5A in a second state.
Figure 5C:
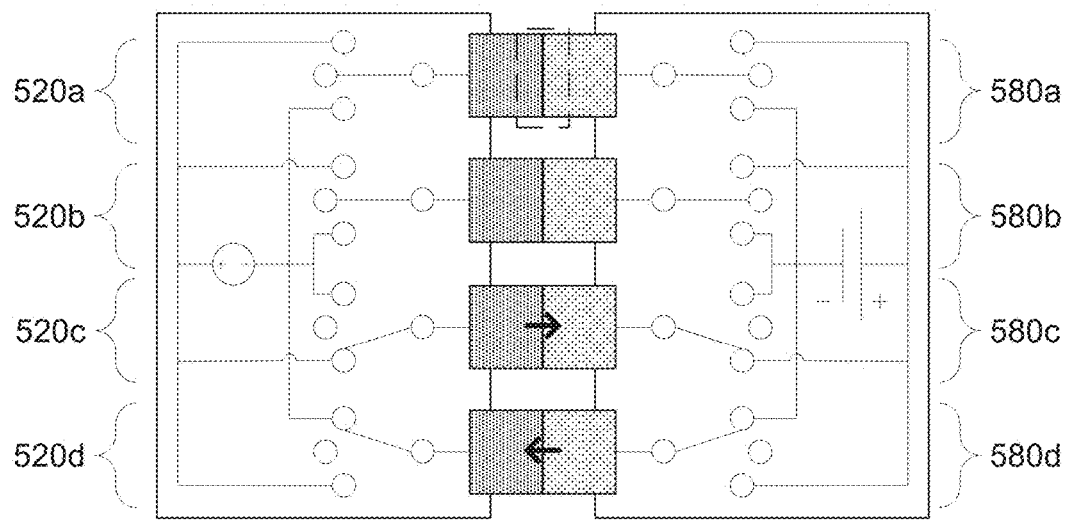
FIG. 5C is a schematic representation of the corrosion-resistant power transfer system of FIG. 5A in a third state.

In this manner, the waveform w1 shown in FIG. 4 may graphically represent the voltage from time t1 to t2, measured, for example from 520a to 5520b as shown in FIG. 5A. Correspondingly, the waveform w2 as shown in FIG. 4 may graphically represent the voltage from time t2 to t3, measured, for example, from 520b to 520a as shown in FIG. 5B. Similarly, waveform w3 corresponds to voltage from time t3 to t4 measured from 520c to 520d as shown in FIG. 5C. Finally, waveform w4 corresponds to voltage from time t4 to t5 measured from 520d to 520c as shown in FIG. 5D.

Figure 5D:
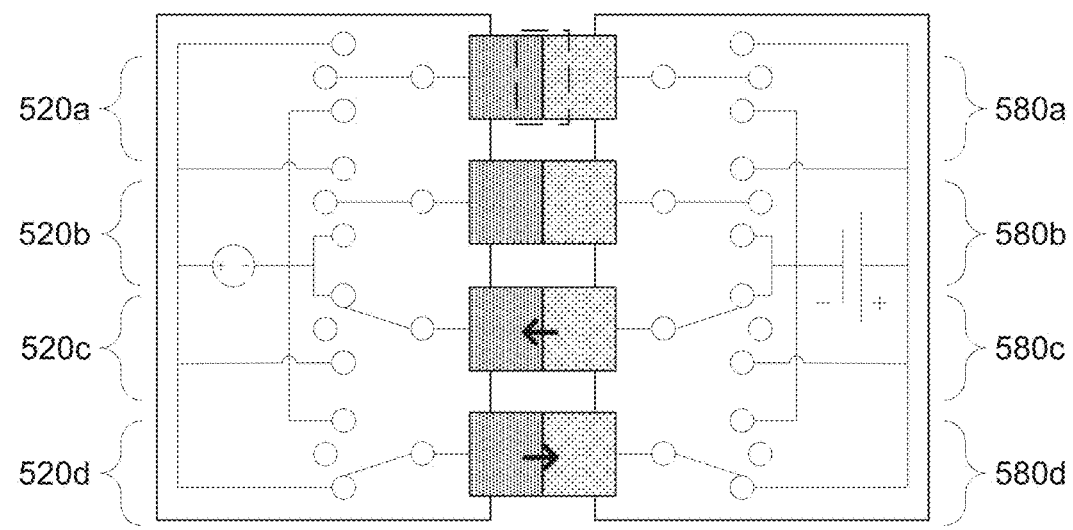
FIG. 5D is a schematic representation of the corrosion-resistant power transfer system of FIG. 5A in a fourth state.
Figure 5E:
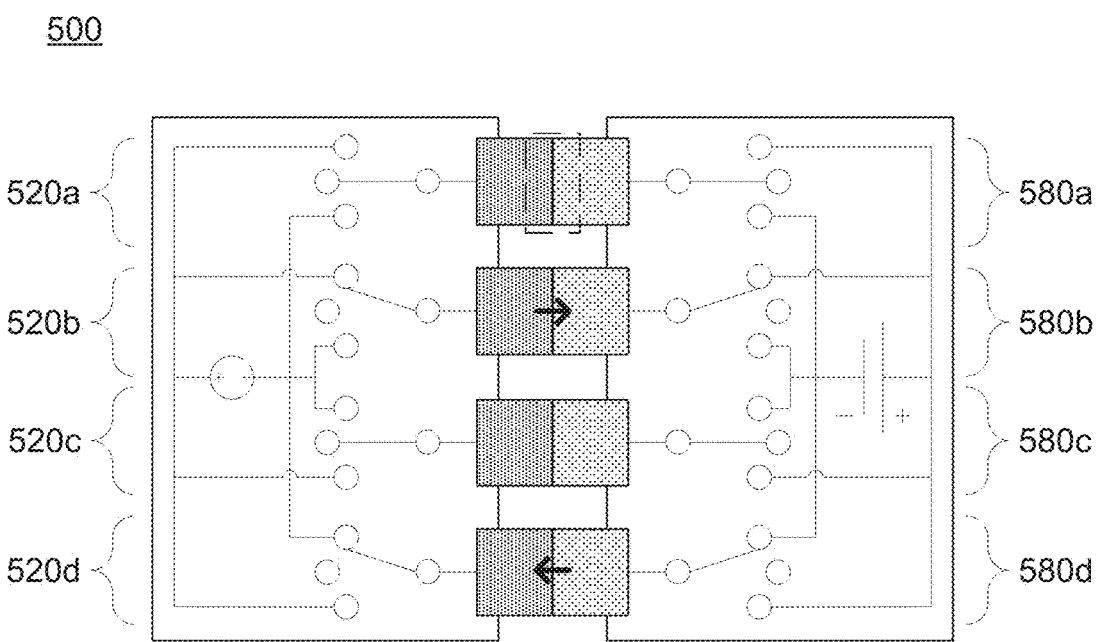
FIG. 5E is a schematic representation of the corrosion-resistant power transfer system of FIG. 5A in a sample arbitrary state.

Similarly, the waveform w5 may graphically represent the voltage across the battery 390 from time t1 to t2 with respect to FIG. 5A and from time t2 to t3 with respect to FIG. 5B from time t3 to t4 with respect to FIG. 5C and from time t4 to t5 with respect to FIG. 5D. In this manner, a constant direct current may be applied to the terminals of the battery from time t1 to t5, even as the power transfer system 500 switches progressively from the configuration shown FIG. 5A to the configuration shown in FIG. 5D.

By selecting pairs of outputs and pairs of inputs, a direct current may be transferred from a direct current power source to a battery in a manner that substantially reduces the time during which a corrosion reaction may begin. One may further appreciate that the selection of pairs outputs and inputs may be arbitrary. For example, the pairs need not be adjacent (see, e.g. FIG. 5E). Furthermore, the pairs need not necessarily be activated in a particular sequence. Any number of sequences or pairings may be possible. In certain embodiments, two: position switches may be used instead of a three: position switch. In this manner, more than one output may be connected to the positive terminal of the direct current power source, or alternately, more than one output may be connected to the negative terminal of the direct current power source.

Furthermore, although switches are shown through the embodiments of FIG. 3A-5E, the embodiments contemplated herein are not limited to physical switches. For example, any number of suitable circuits may be applied to switch a particular output at a particular time. For example, switches may be solid state relays or MOSFETs. In other embodiments, the switches may be controllable by a microcontroller. In such embodiments, the individual outputs may be switched at a very rapid rate.

Correspondingly, the switches illustrated in the load portion of FIGS. 3A-5E need not be physical switches. For example, switches may be solid state relays or MOSFETs. In other embodiments, the switches may be controllable by a microcontroller. Alternately, switches may not be used at all. Instead, voltage rectifiers or other configurations of diodes may be used.

Figure 6A:
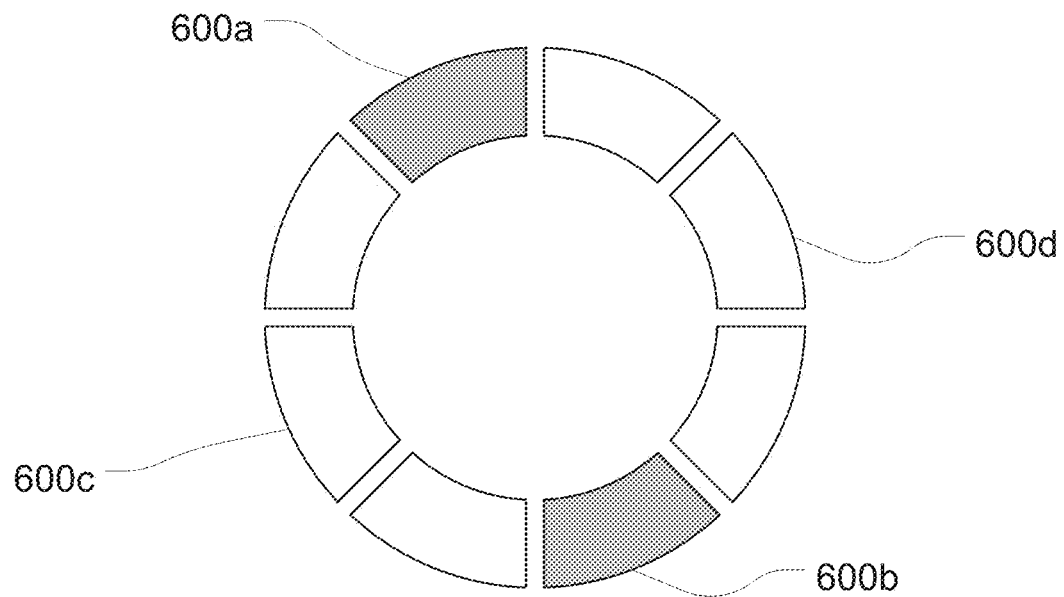
FIG. 6A is a plan view of a corrosion-resistant power transfer system having eight outputs in a first state.
Figure 6B:
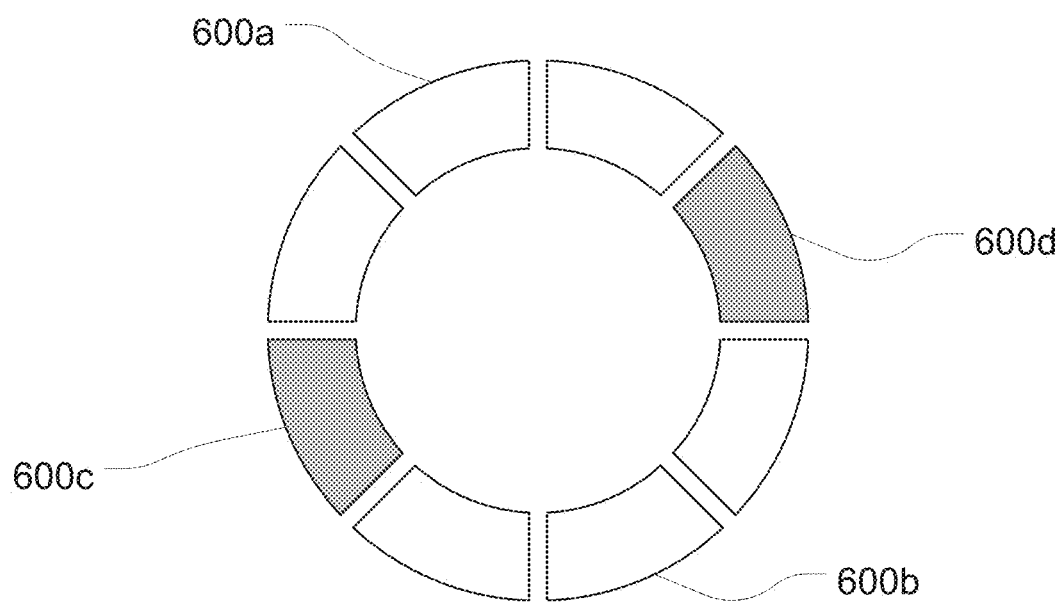
FIG. 6B is a plan view of the corrosion-resistant power transfer system of FIG. 6A in a second state.

FIG. 6A-6B illustrate an example embodiment of a corrosion-resistant power transfer system showing eight outputs arranged in a radial pattern. In this manner, corrosion may further be reduced by selecting pairs that are 90 degrees separated from the previously activated pair. For example, FIG. 6A shows a first pair of outputs, 600*a* and 600*b* respectively activated. As noted above, activation of this pair may include setting 600*a* to +5V with 600*b* at 0V. After a period of time, the voltage may be reversed between the two outputs. Next, FIG. 6B shows a second pair of outputs, 600*c* and 600*d* respectively activated. In this embodiment, outputs 600*c* and 600*d* may be activated immediately after outputs 600*a* and 600*b* specifically because the output pairs are 90 degrees separated from one another about the central point of the radial arrangement.

Although the disclosure is provided above in terms of various exemplary embodiments, implementations, and configurations it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present disclosure should not be limited by any of the above-described exemplary embodiment.

Figure 7:
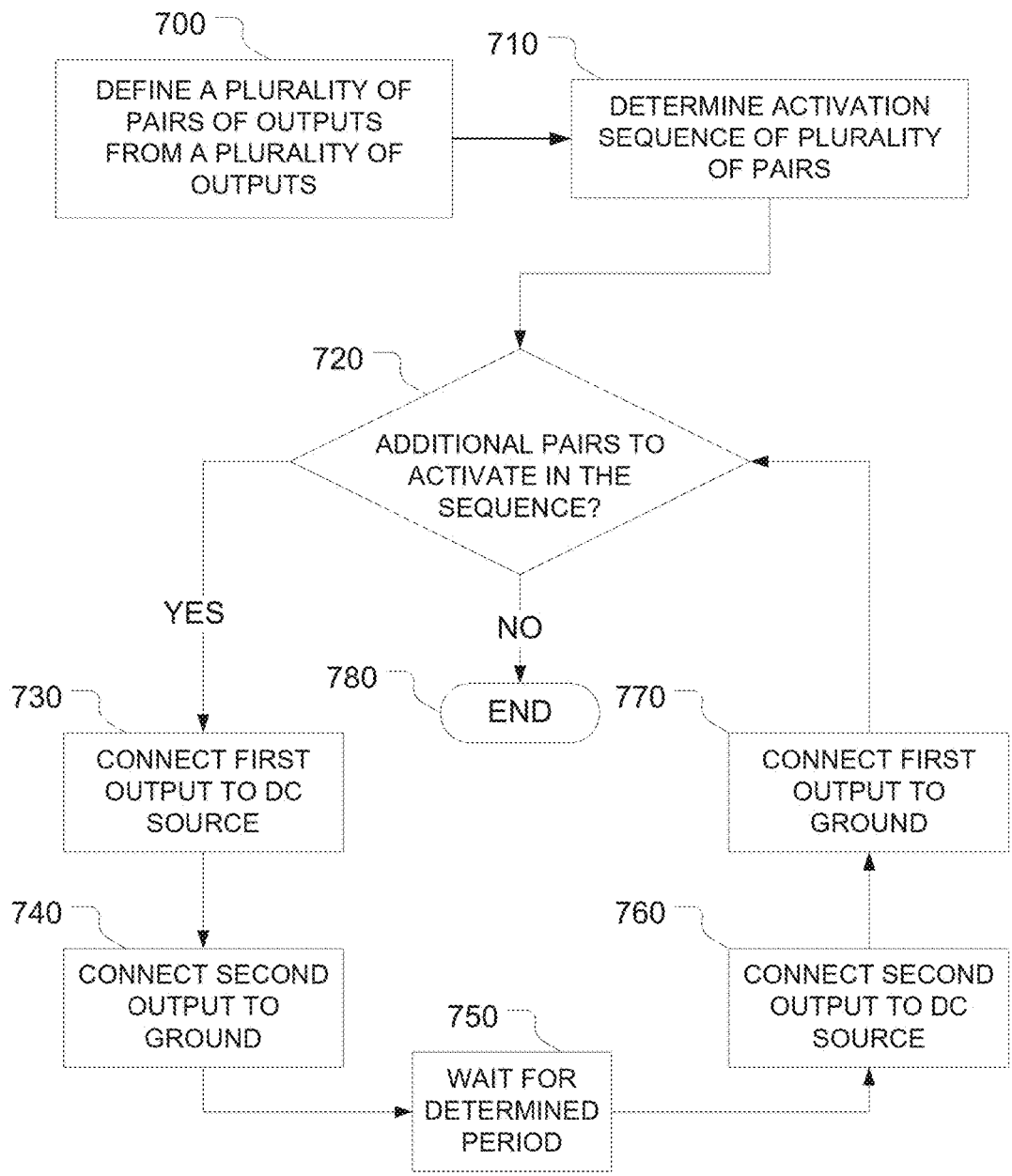
FIG. 7 is a process illustrating sample steps of a method of transferring power while preventing corrosion to external contacts of the power transfer system.

FIG. 7 is a process illustrating sample steps of a method of transferring power while preventing corrosion to external contacts of the power transfer system. The process may begin at 700, in which a grouping of pairs of outputs may be defined from a plurality of outputs. For example, if four outputs are present for a particular embodiment, step 700 may determine that output 1 and output 2 should be paired, and that output 3 and output 4 should be pair. At 710 the process may determine an order that each pair should be activated. For example, that pair (1, 2) may be activated first, then pair (3, 4) may be activated second. At 720, the determine activation sequence may begin. For each individual activation, step 730 and 740 may set a first and second output of the selected pair to a direct current power source and a circuit ground respectively. Thereafter, the process may wait at 750 for a predetermined period.

In some embodiments, the predetermined period that each output of a pair is activated may be based at least in part on the corrosion rates of the materials including each of the outputs of the selected pair of outputs. In other examples, the predetermined period may be based on the surface area of the selected outputs. In other examples, the predetermined period may be arbitrarily chosen. For example, in some embodiments, the period may be for seconds, minutes or hours.

After the predetermined period has lapsed, step 760 and 770 may set the first and second output of the selected pair to circuit ground and a direct current power source respectively, reversing the previous polarity defined in steps 730 and 740. Next, the process may continue to 720 to activate the next pair in the sequence.

When it is determined that no more pairs are present in the sequence, the process may terminate at 780.

In some embodiments, the sequence determine in 710 may be repeated any number of times. For example, the sequence may be repeated as long as the power source is connected or coupled to the portable electronic device. In other embodiments, the sequence may be terminated by a microcontroller instruction. The instruction to terminate the sequence may be the result of receiving a signal from the portable electronic device that the internal battery is fully charged. In other embodiments, the microcontroller instruction may be the result of short circuit detection circuitry, or current loading circuitry. In these embodiments, the sequence may be terminated in order to prevent damage to a portable electronic device coupled to the power transfer system. In still further embodiments, the microcontroller instruction may be the result of a signal received from the portable electronic device indicating that one or more of the charging contacts are no longer operable. For example, if a first and second input are no longer operable, then the determined sequence may intentionally exclude those contacts.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

We claim:

1. A power transfer system comprising:
   a direct current source;
   three or more outputs, each output comprising:
      a ground mode in which the output is coupled to ground; and
      a current mode in which the output is coupled to the direct current source; and
   an output controller configured to iteratively select a pair of outputs from the three or more outputs, the pair of outputs comprising a first output and a second output, and, upon each selection, the output controller is configured to:
      set the first output of the pair of outputs to the current mode and the second output of the pair of outputs to ground mode for a determined duration;
      set the first output to the ground mode and the second output to the current mode for the determined duration.

2. The power transfer system of claim 1, wherein each output of the three or more outputs further comprises a float mode in which the output is floating.

3. The power transfer system of claim 2, wherein the output controller is configured to, upon each selection, set each of the three or more outputs not selected to the float mode.

4. The power transfer system of claim 1, wherein the output controller is configured to select pairs of outputs such that each sequential pair contains two outputs that were not members of the previous pair.

5. The power transfer system of claim 1, wherein the determined duration of each selection is based in part on a corrosion rate of a material used to form an external surface of at least one output of the pair of outputs.

6. The power transfer system of claim 1, wherein the determined duration of each selection is based in part on the surface area of each of the outputs of the selected pair of outputs.

7. The power transfer system of claim 1, wherein the determined duration of each selection is based in part on a detected corrosion of at least one of the outputs of the selected pair of outputs.

8. The power transfer system of claim 1, wherein the output controller is configured to select pairs of outputs such that each output of the three or more outputs is selected only a certain number of times per second.

9. A power transfer system comprising:
three or more outputs; and
an output controller configured to iteratively select a pair of outputs from the three or more outputs, and upon each selection adapted to:
apply one period of a selected direct current waveform to a first output of the selected pair of outputs with a second output of the selected pair of outputs connected to ground;
apply one period of the selected direct current waveform to the second output with the first output connected to ground.

10. The power transfer system of claim 9, wherein the output controller is configured to select pairs of outputs such that each sequential pair contains two outputs that were not members of the previous pair.

11. The power transfer system of claim 9, wherein the output controller is configured to, upon each selection, set each of the three or more outputs not selected to float.

12. The power transfer system of claim 9, wherein the direct current waveform of each selection is based in part on a corrosion rate of a material used to form an external surface of at least one output of the pair of outputs.

13. The power transfer system of claim 9, wherein the direct current waveform of each selection is based in part on the surface area of each of the outputs of the selected pair of outputs.

14. The power transfer system of claim 9, wherein the direct current waveform of each selection is based in part on a detected corrosion of at least one of the outputs of the selected pair of outputs.

15. The power transfer system of claim 9, wherein the output controller is configured to select pairs of outputs such that each output of the three or more outputs is selected only a certain number of times per second.

16. A method of reducing corrosion to outputs of a direct current power system comprising:
defining a plurality of output pairs from three or more outputs;
determining a pair activation sequence such that each sequential pair contains two outputs that were not within the previous pair; and
sequentially activating each pair in the activation sequence, each sequential activation comprising:
connecting a first output of the pair to a direct current source;
connecting a second output of the pair to a ground for a selected duration;
connecting the second output to a direct current source;
connecting the first output to a ground for the selected duration; and
causing the first output and the second output to float.

17. The method of claim 16, wherein each sequential activation occurs immediately after the previous activation.

18. The method of claim 16, wherein each sequential activation begins before the previous activation completes.

19. The method of claim 16, wherein the selected duration of each activation is based in part on the surface area of each of the outputs of the selected pair of outputs.

20. The method of claim 16, wherein the selected duration of each activation is based in part on a corrosion rate of a material used to form an external surface of at least one of the two outputs.

21. The method of claim 16, wherein each sequential activation comprises:
applying one period of a selected direct current waveform to a first output of the pair;
connecting a second output of the pair to a ground for a selected duration;
applying one period of the selected direct current waveform to the second output;
connecting the first output to a ground for the selected duration; and
causing the first output and the second output to float.

* * * * *